United States Patent
Park et al.

(10) Patent No.: US 7,679,113 B2
(45) Date of Patent: *Mar. 16, 2010

(54) CMOS IMAGE SENSOR AND METHOD OF FABRICATING THE SAME

(75) Inventors: Young-Hoon Park, Kyunggi-do (KR); Sang-Il Jung, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 277 days.

This patent is subject to a terminal disclaimer.

(21) Appl. No.: 11/446,925

(22) Filed: Jun. 5, 2006

(65) Prior Publication Data

US 2006/0231870 A1   Oct. 19, 2006

Related U.S. Application Data

(63) Continuation of application No. 10/461,265, filed on Jun. 13, 2003, now Pat. No. 7,057,219.

(30) Foreign Application Priority Data

Sep. 11, 2002   (KR) ................... 2002-54907

(51) Int. Cl.
*H01L 31/103* (2006.01)

(52) U.S. Cl. .......... 257/292; 257/E31.12; 257/E31.122; 257/443

(58) Field of Classification Search ................... 257/292
See application file for complete search history.

(56) References Cited

U.S. PATENT DOCUMENTS

| | | | |
|---|---|---|---|
| 6,465,786 B1 * | 10/2002 | Rhodes | 250/338.4 |
| 6,740,915 B1 | 5/2004 | Rhodes | |
| 2003/0234432 A1 | 12/2003 | Song et al. | |

FOREIGN PATENT DOCUMENTS

| | | |
|---|---|---|
| JP | 11-317512 | 11/1999 |
| JP | 2000-082839 | 3/2000 |
| JP | 2001-345439 | 12/2001 |
| JP | 2002-190586 | 7/2002 |

* cited by examiner

*Primary Examiner*—Jerome Jackson, Jr.
(74) *Attorney, Agent, or Firm*—F. Chau & Associates, LLC

(57) ABSTRACT

A CMOS image sensor and a method of fabricating the same are provided. The image sensor includes a blocking layer protecting a photodiode at a diode region. The blocking layer is formed to cover a top of the diode region and extended to an active region so as to cover a transfer gate and a floating diffusion layer. Therefore, the floating diffusion layer may not be attacked by an etching during a formation of sidewall spacers of various gates or by ion implantation during a formation of a junction region of a DDD or LDD structure, thus reducing a leakage current and a dark current at the floating diffusion layer.

18 Claims, 6 Drawing Sheets

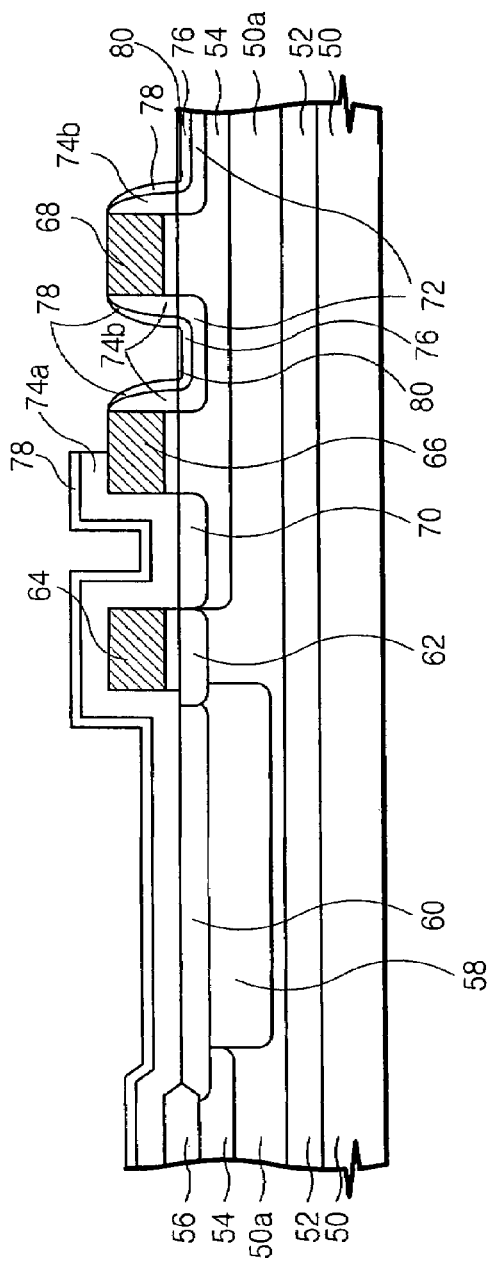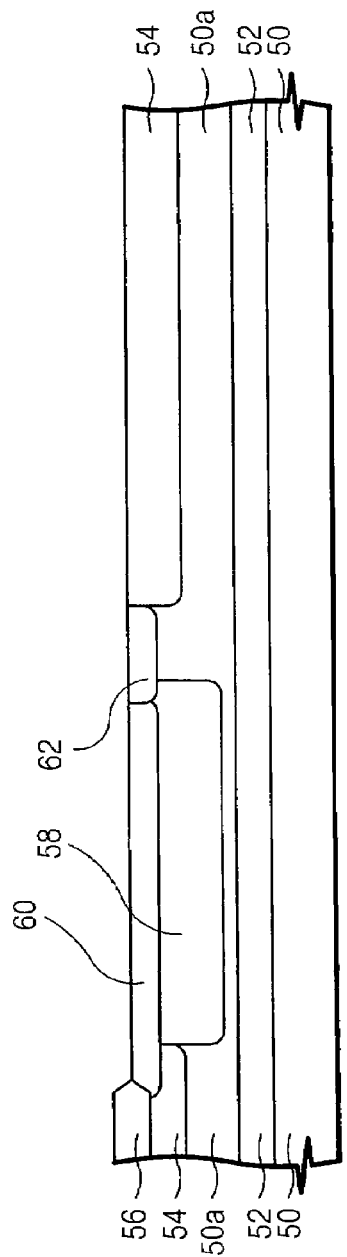

CMOS IMAGE SENSOR AND METHOD OF FABRICATING THE SAME

CROSS-REFERENCE TO RELATED APPLICATION

This application is a Continuation of U.S. application Ser. No. 10/461,265 filed on Jun. 13, 2003 now U.S. Pat. No. 7,057,219, which is fully incorporated herein by reference.

FIELD OF THE INVENTION

The present invention relates generally to a CMOS image sensor and methods of fabricating the same and, more specifically, to a CMOS image sensor having a reduced a dark current and fabrication methods thereof.

BACKGROUND OF THE INVENTION

A CMOS image sensor transforms optical images to electrical signals using CMOS technologies. The CMOS image sensor employs a switching method that sequentially generates signals using MOS transistors. The CMOS image sensor has several advantages such as a simple operation process, low fabrication costs and low power consumption. On the contrary, a charge coupled device (CCD) image sensor is difficult to fabricate compared to the CMOS image sensor and impossible to access randomly. Since the late 1990s, fabrication methods of CMOS technologies and signal processing algorithms thereof have been improved. Therefore, many disadvantages of the CMOS have been overcome. Moreover, the CCD technology has been partially employed in the CMOS image sensor, so that product qualities of the CMOS image sensor have been further improved.

FIG. 1 is a schematic circuit diagram of a typical CMOS image sensor 100. Referring to FIG. 1, the typical CMOS image sensor 100 includes a photodiode Pd, a transfer transistor Tx, a reset transistor Rx, a selection transistor Sx and an access transistor Ax. The transfer transistor Tx and the reset transistor Rx are connected in serial to the photodiode Pd. An applied voltage Vdd is supplied to a drain of the reset transistor Rx. A drain of the transfer transistor Tx (i.e., a source of the reset transistor Rx) corresponds to a floating diffusion layer (F/D). The floating diffusion layer (F/D) is connected to a gate of the selection transistor Sx. The selection transistor Sx and the access transistor Ax are connected in serial and an applied voltage Vdd is supplied to a drain of the selection transistor Sx.

An operation method of the CMOS image sensor 100 will be explained as follows. First, the reset transistor Rx is turned on, so that a voltage of the floating diffusion layer (F/D) becomes the applied voltage Vdd. If light is incident to the photodiode Pd, electron-hole pairs (EHPs) are generated and signal electrons are accumulated in a source of the transfer transistor Tx. When the transfer transistor Tx is turned on, the accumulated signal electrons are transferred to the floating diffusion layer (F/D) to change a voltage of the floating diffusion layer (F/D). At same time, a gate voltage of the selection transistor Sx changes to the voltage of the floating diffusion layer. When a selection signal Row turns on the access transistor Ax, the applied voltage Vdd is transferred to an output terminal Out. Then, the reset transistor Rx is turned on again and the voltage of the floating diffusion layer (F/D) is made equal to the applied voltage Vdd. Through repeating these steps, image signals are generated.

FIG. 2 is a top plan view of a typical CMOS image sensor. Referring to FIG. 2, the CMOS image sensor includes a device isolation pattern 56 that is formed in a substrate to define a diode region 40 and an active region 42. Conventionally, the diode region 40 is formed to be wide so as to increase a photo efficiency. The active region 42 is extended from a side of the diode region 40. Transfer gates 64 and 24, reset gates 66 and 26 and selection gates 68 and 28 are serially formed and separated by a predetermined distance. Although not illustrated in the drawings, an access gate is formed separate from the selection gates 68 and 28 by a predetermined distance. The transfer gate Tx is formed in the active region 42 adjacent to the diode region 40. Floating diffusion layers 70 and 38 are formed in the active region 42 between the transfer gates 64 and 24 and the reset gates 66 and 26. Although not illustrated in the drawings, the floating diffusion layers 70 and 38 and the selection gate 68 and 28 are electrically connected through interconnections.

FIGS. 3 and 4 are cross-sectional views taken along line A-A of FIG. 2 for illustrating steps of fabricating a conventional CMOS image sensor. Referring to FIG. 3, a deep P well 12 is formed in a semiconductor substrate. The deep P well 12 may be formed in a substrate between a P type epitaxial layer 10a and a silicon substrate 10. By implanting impurities into the P type epitaxial layer 10a, a P well 14 is formed in the P type epitaxial layer 10a. The P well 14 is formed adjoining a diode region 40 of FIG. 2 that will be defined in a subsequent process. A device isolation pattern 16 of FIG. 2 is formed to define an active region 42 of FIG. 2 and the diode region 40 of FIG. 2. An N type channel diffusion layer 22 is formed in an active region 42 of FIG. 2 adjacent to the diode region 40 of FIG. 2. A transfer gate 24, a reset gate 26 and a selection gate 28 are serially formed on the active region 42 of FIG. 2 separated from each other. The transfer gate 24 is formed on the N type channel diffusion layer 22. Impurities are implanted into the diode region 40 of FIG. 2 to form an N type photodiode 18. A P type photodiode 20 is formed on the N type photodiode 18. The N type and P type photodiodes 18 and 20 may be formed prior to forming the gates.

Next, the impurities are implanted into the active region 42 of FIG. 2 to form lightly doped diffusion layers 30 and 32 aligned to sidewalls of the transfer, reset and selection gates 24, 26 and 28.

Referring to FIG. 4, an insulation layer is formed on an entire surface of the substrate with the lightly doped diffusion layers 30 and 32. A photoresist pattern is formed to cover the diode region 40 of FIG. 2 and expose the active region 42 of FIG. 2. Next, using the photoresist as an etch mask, the insulation layer is anisotropically etched to form a blocking layer 34a covering the diode region 40 of FIG. 2 and sidewall spacers 34b on sidewalls of the transfer gate 24, the reset gate 26 and the selection gate 28. Then, the photoresist is removed. In the conventional CMOS image sensor, the blocking layer 34a covers the diode region 40 of FIG. 2 and is extended in a lateral direction to conformally cover a portion of a top surface and a sidewall of the transfer gate 24. Using the blocking layer 34a, the gates 24, 26 and 28 and the sidewall spacers 34b as an etching mask, impurities are implanted into the substrate to form heavily doped diffusion layers 36, which are aligned to outer edges of the sidewall spacers 34b, in the lightly doped diffusion layers 30 and 32. As a result, diffusion layers with a DDD (double doped drain) structure are formed in the active region 42 of FIG. 2. Alternatively, diffusion layers with a LDD (lightly doped drain) structure may be formed in the active region 42 of FIG. 2. The lightly and heavily doped diffusion layers 30 and 36 between the transfer gate 24 and the reset gate 26 compose a floating diffusion layer 38 of an image sensor.

According to the prior art, after covering the diode region 40 of FIG. 2, the insulation layer is etched anisotropically, so that a surface of the P type photodiode 20 may be protected from being attacked. Therefore, a dark current can be drastically reduced at a surface of the P type photodiode 20. However, during a formation of the sidewall spacers 34b, a surface of the active region, where the floating diffusion layer 38 is formed, may be damaged from etching and crystalline defects of the active region can occur due to high energy of the ions during the formation of the heavily doped diffusion layers 36. Therefore, a leakage current pass is created at the floating diffusion layer 38, so that a voltage of the floating diffusion layer 38 may not be increased. As a result, output signals may be leveled down or not be generated. In addition, if the diffusion is formed to have an LDD structure, the floating diffusion layer 38 will have a large probability of suffering from a leakage current due to a high voltage between the heavily doped diffusion layers 36 and the P well 14.

SUMMARY OF THE INVENTION

It is an aspect of the present invention to provide a CMOS image sensor having a reduced a leakage current of a floating diffusion layer and a method of fabricating the same.

It is another aspect of the present invention to provide a CMOS image sensor having a decreased a dark current of a floating diffusion layer and a method of fabricating the same.

According to one aspect of the present invention, a CMOS image sensor of an embodiment of the present invention includes a device isolation pattern that is formed in a substrate and defining a diode region and an active region. A photodiode is formed in the diode region and a transfer gate is formed in the active region adjacent to the photodiode. A reset gate and a selection gate are serially formed on the active region separated from the transfer gate by a predetermined distance. The reset gate and the selection gate are separated from each other. A floating diffusion layer is formed in the active region between the transfer gate and the reset gate. A blocking layer protecting the photodiode is formed on the diode region. The blocking layer is extended to the active region to cover tops of the transfer gate and the floating diffusion layer. Therefore, the blocking layer prevents the floating diffusion layer from being attacked so as to significantly reduce a leakage current and a dark current occurring at the floating diffusion layer.

According to the another aspect of the present invention, a method of fabricating a CMOS image sensor comprises as follows. A device isolation pattern is formed in a substrate so as to define a diode region and an active region and a photodiode is formed in the diode region. A transfer gate, a reset gate and a selection gate are serially formed and laterally separated from each other by a predetermined distance. In this case, the transfer gate is formed on the active region adjacent to the diode region. A floating diffusion layer is formed in the active region between the transfer gate and the reset gate. At the same time, lightly doped diffusion layers are formed in active regions between the reset gate and the selection gate and an active region adjacent to the selection gate. Sidewall spacers are formed on a sidewall of the reset gate facing the selection gate and sidewalls of the selection gate. In this case, a blocking layer is formed to cover a top of the diode region and extended to the active region to cover the transfer gate and the floating diffusion layer. Finally, impurities are implanted into the active regions to form heavily doped diffusion layers, which are aligned to outer surfaces of the sidewall spacers, in the lightly doped diffusion layers. The floating diffusion layer is protected by the blocking layer and may not be attacked by the etching during a formation of the sidewall spacers or by the ion implantation during a formation of the heavily doped diffusion layer.

BRIEF DESCRIPTION OF THE DRAWINGS

FIG. 5 is a cross-sectional view of a CMOS image sensor in accordance with an embodiment of the present invention; and FIGS. 6-8 are cross-sectional views illustrating steps of fabricating a CMOS image sensor in accordance with an embodiment of the present invention.

DETAILED DESCRIPTION OF PREFERRED EMBODIMENTS

Figure 1:
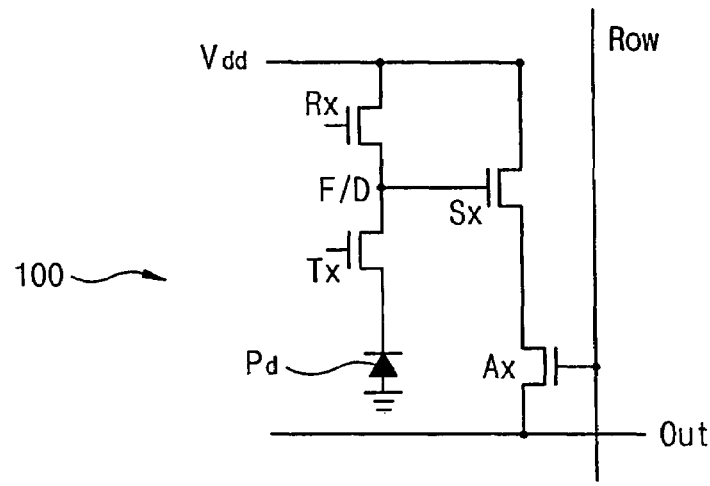
FIG. 1 is a schematic circuit diagram of a typical CMOS image sensor.

The present invention will now be described more fully hereinafter with reference to the accompanying drawings, in which preferred embodiments of the invention are shown. This invention may, however, be embodied in different forms and should not be constructed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate or intervening layers may also be present. Like numbers refer to like elements throughout the specification.

FIG. 5 is a cross-sectional view of a CMOS image sensor in accordance with a preferred embodiment of the present invention. Referring to FIG. 5, a CMOS image sensor according to an embodiment of the present invention includes a device isolation pattern 56 defining a diode region 40 of FIG. 2, an active region 42 of FIG. 2 and a deep P type well 52 that are formed in a substrate, and P type well 54 formed in a substrate adjacent to the diode region 40 of FIG. 2. A transfer gate 64, a reset gate 66 and a selection gate 68 are serially disposed on the active region 42 of FIG. 2. An N type channel region 62 is formed in a substrate beneath the transfer gate 64 and a floating diffusion layer 70 is formed in an active region between the transfer gate 64 and the reset gate 66. The CMOS image sensor of the present invention includes a blocking layer 74a conformally covering tops of the diode region 40 of FIG. 2, the transfer gate 64 and the floating diffusion layer 70. The blocking layer 74a may be extended in a lateral direction to cover a sidewall and a portion of a top surface of the reset gate 66. Sidewall spacers 74b are formed on the other sidewall of the reset gate 66 and both sidewalls of the selection gate 68. Lightly doped diffusion layers 72 are formed in active regions between a sidewall of the reset gate 66 and a sidewall of the selection gate 68, which face each other, and in an active region adjacent to the opposite sidewall of the selection gate 68. The lightly doped diffusion layers 72 are aligned to the sidewalls of the reset gate 66 and the selection gate 68. Heavily doped diffusion layers 76 aligned to outer surfaces of the sidewall spacers 74b are formed in each of the lightly doped diffusion layers 72, respectively. The lightly and heavily doped diffusion layers 72 and 76 correspond to a junction region of a transistor. The junction region may be formed to have a double doped drain (DDD) or a lightly doped drain (LDD) structure. As illustrated in FIG. 5, a floating diffusion layer 70 of the CMOS image sensor may have a single-layered structure and a top thereof is covered with a blocking layer 74a. Therefore, etching and implantation damage may be prevented during the fabrication processes, so that a leakage current and a dark current occurring at the floating diffusion layer can be drastically reduced.

In addition, protection layers 78 may be formed on tops of the blocking layer 74a and the sidewall spacers 74b, respectively, and salicide layers 80 may be formed in the heavily doped diffusion layers 76 aligned to sidewalls of the protection layer 78.

Figure 7:
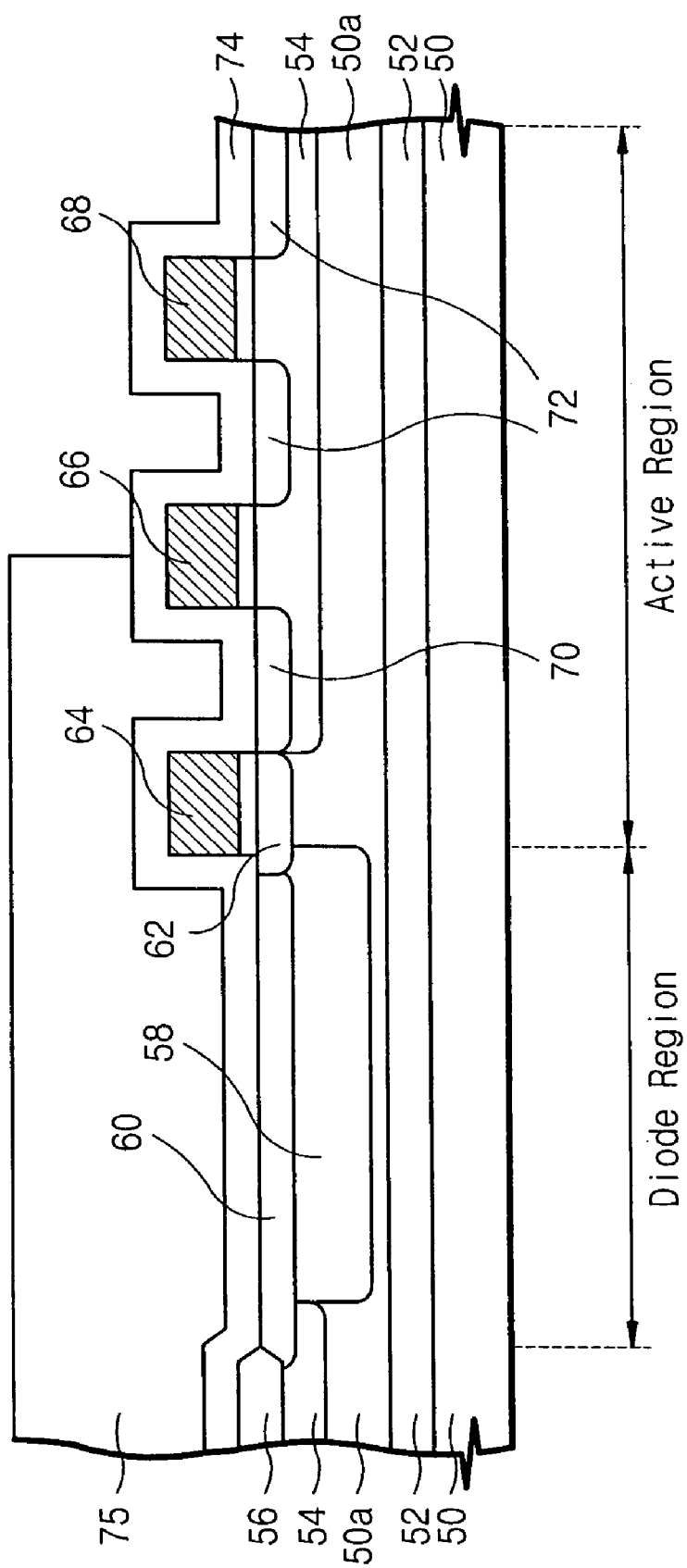
Figure 8:
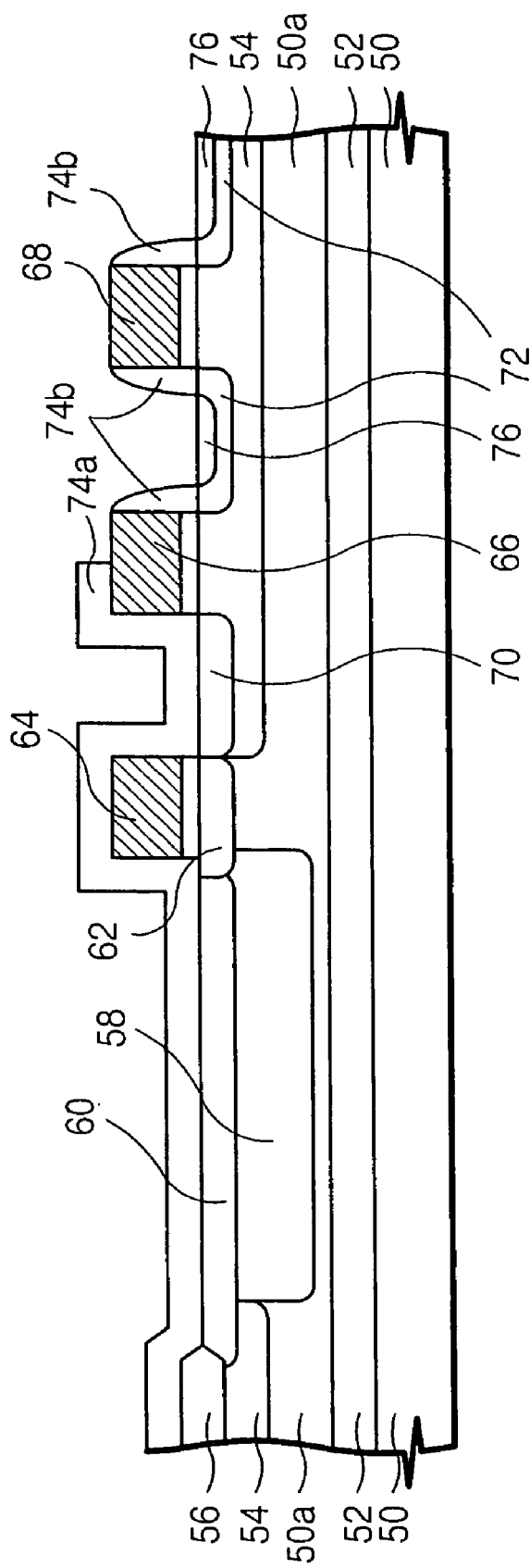

FIGS. 6-8 are cross-sectional views illustrating steps of fabricating a CMOS image sensor in accordance with a preferred embodiment of the present invention. Referring to FIG. 6, a deep P well 52 is formed in a substrate by implanting impurities into the substrate. The substrate may be formed by stacking a P type epitaxial layer 50a on a silicon substrate 50. The deep P well 52 may be formed at a boundary region between the silicon substrate 50 and the P type epitaxial layer 50a by implanting impurities into the P type epitaxial layer 50a. The deep P well 52 is doped with a concentration higher than that of the P type epitaxial layer 50a.

Figure 2:
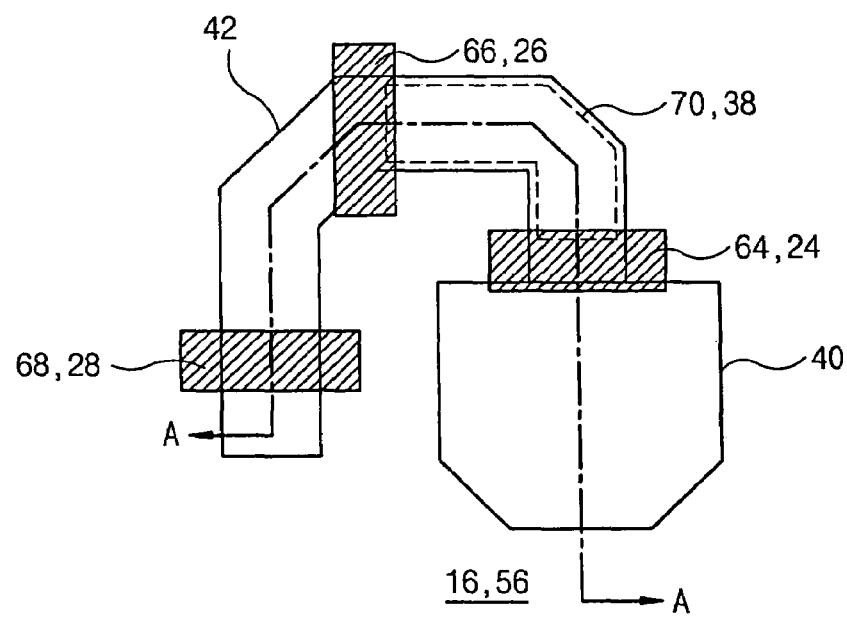
FIG. 2 is a top plan view of a typical CMOS image sensor.
Figure 3:
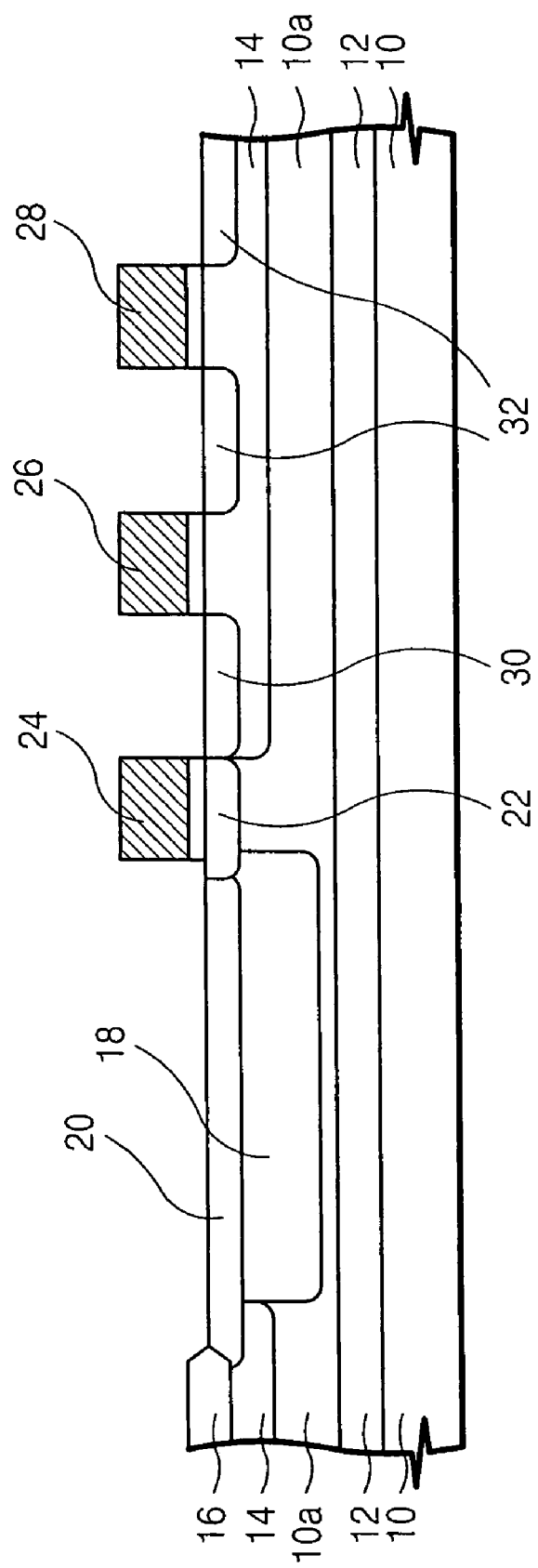
FIGS. 3 and 4 are cross-sectional views illustrating steps of fabricating a conventional CMOS image sensor.
Figure 4:
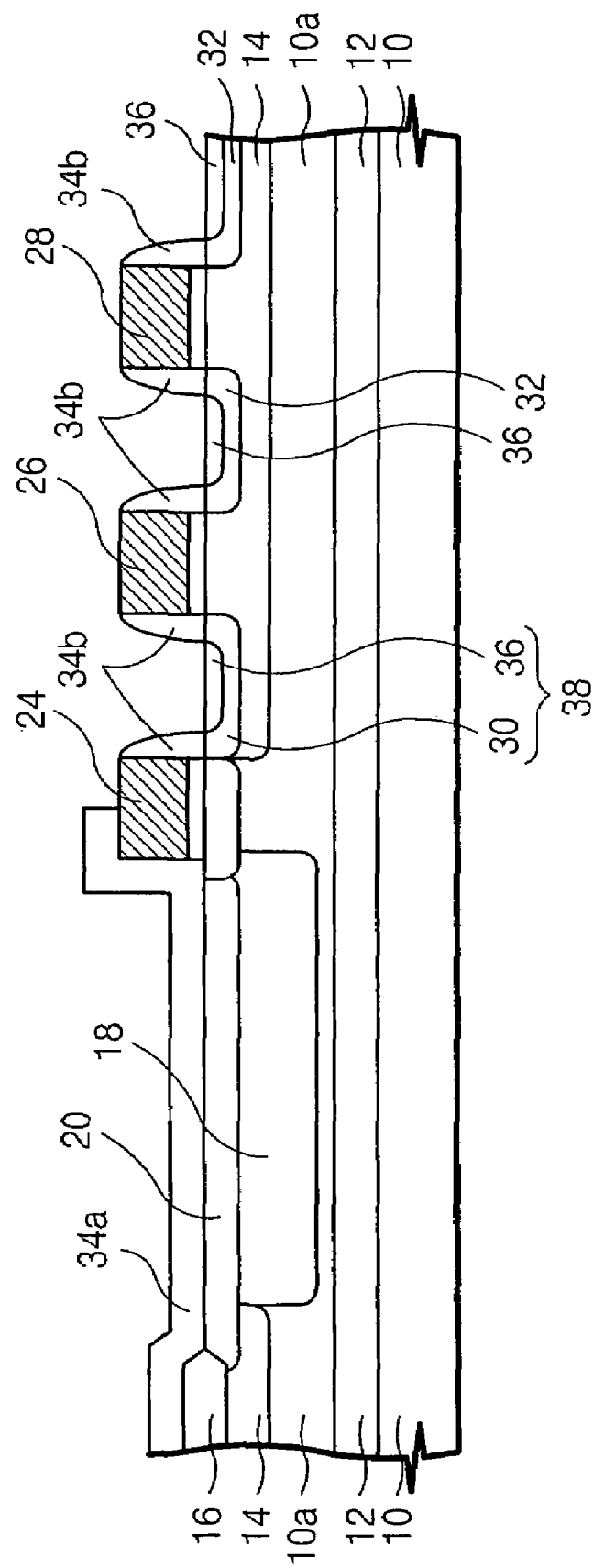

A device isolation pattern 56 is formed in the substrate to define a diode region 40 of FIG. 2 and an active region 42 of FIG. 2. A P well 54 is formed in the P type epitaxial layer 50a adjacent to the diode region 40 of FIG. 2. An N type channel diffusion layer 62 is formed in the active region 42 of FIG. 2 adjacent to the diode region 40 of FIG. 2. The P well 54 is doped with a concentration higher than that of the P type epitaxial layer 50a. An N type photodiode 58 is formed in the diode region 40 of FIG. 2. A P type photodiode 60 is formed on the N type photodiode 58. The N type photodiode 58 is preferably connected to the N type channel diffusion layer 62 and the P type photodiode 60 is preferably connected to the P well 54.

Referring to FIG. 7, a transfer gate 64, a reset gate 66 and a selection gate 68 are serially formed on the active region 42 of FIG. 2 separated from each other by a predetermined distance. Different from the previously mentioned steps, the P well 54 may be formed prior to forming the device isolation pattern 56, and the N type channel diffusion layer 62, the N type photodiode 58, the P type photodiode 60 and the gates 64, 66 and 68 may be formed in different orders. That is, the N type and P type photodiodes 58 and 60 may be formed after forming the gates.

Impurities are implanted into active regions among the transfer gate 64, the reset gate 66 and the selection gate 68, thereby forming an N type floating gate 70 in an active region between the transfer gate 64 and the reset gate 66, and a N type lightly doped diffusion layer 72 in an active region at both sides of the selection gate 68. An insulation layer 74 is formed on an entire surface with the floating diffusion layer 70 and the lightly doped diffusion layers 72. A photoresist pattern 75 is formed on the insulation layer 74 to cover tops of the P type photodiode 60, the transfer gate 64 and the floating diffusion layer 70. The photoresist pattern 75 may be extended in a lateral direction, thereby covering a portion of a top of the reset gate 66.

Referring to FIG. 8, using the photoresist pattern 75 as an etch mask, the insulation layer 74 is etched to form a blocking layer 74a covering tops of the P type photodiode 60, the transfer gate 64 and the floating diffusion layer 70. Sidewall spacers 74b are formed on a sidewall of the reset gate 66 and a sidewall of the selection gate 68, which face each other, and the other sidewall of the selection gate 68, respectively. Next, impurities are implanted into the active region to form N type heavily doped diffusion layers 76. The N type heavily doped diffusion layers 76 are aligned to outer edges of the sidewall spacers 74b. The heavily and lightly doped diffusion layers 76 and 72 may be formed to construct a DDD structure as illustrated in FIG. 8 or to have an LDD structure. Contrary to the prior art, the floating diffusion layer 70 of an embodiment of the present invention may not be attacked by an etching during a formation of the sidewall spacers 74b or by an ion implantation during a formation of the heavily doped diffusion layers 76. Thus, crystalline defects causing a leakage current and a dark current can be reduced.

Next, using a conventional method, protection layers 78 of FIG. 5 are formed to cover tops of the blocking layer 74a and the sidewall spacers 74b, respectively and then salicide layers 80 of FIG. 5 aligned to the protection layers 78 may be formed on the active region.

According to embodiments of the present invention, a blocking layer covering a top of a diode region is extended in a lateral direction to cover a floating diffusion layer, thereby reducing a leakage current and a dark current occurring at the floating diffusion layer. Therefore, CMOS image sensors outputting high quality signals can be achieved.

What is claimed is:

1. A CMOS image sensor, comprising:
   a device isolation pattern formed in a substrate to define a diode region and an active region;
   a photodiode formed in the diode region;
   a transfer gate formed adjoining the photodiode on the active region;
   a reset gate and a selection gate serially formed apart from each other on the active region separated from the transfer gate by a predetermined distance;
   a floating diffusion layer formed in the active region between the transfer gate and the reset gate; and
   a blocking layer that covers at least the floating diffusion layer and wherein the blocking layer does not cover the active region disposed between a sidewall of the selection gate and a sidewall of the reset gate, which face each other and wherein the blocking layer does not cover the active region located adjacent to an opposing sidewall of the selection gate.

2. The CMOS image sensor of claim 1, wherein the blocking layer covers the photodiode.

3. The CMOS image sensor of claim 2, wherein the blocking layer covers at least a portion of the transfer gate.

4. The CMOS image sensor of claim 3, wherein the blocking layer covers at least a portion of the reset gate.

5. The CMOS image sensor of claim 1, wherein the photodiode further comprises: an N type photodiode formed in the diode region; and
   a P type photodiode formed at a surface of the diode region on the N type photodiode.

6. The CMOS image sensor of claim 5, further comprising an N type channel diffusion layer formed in an active region beneath the transfer gate, wherein the channel diffusion layer and the N type photodiode are in electrical contact with each other.

7. The CMOS image sensor of claim 5, further comprising a P type well formed in the substrate adjacent to the diode region, wherein the P type photodiode is electrically connected to the P type well.

8. A CMOS image sensor, comprising:
   a device isolation pattern formed in a substrate to define a diode region and an active region;
   a photodiode formed in the diode region;
   a transfer gate formed adjoining the photodiode on the active region;

a reset gate and a selection gate serially formed apart from each other on the active region separated from the transfer gate by a predetermined distance;

a floating diffusion layer formed in the active region between the transfer gate and the reset gate; and a patterned blocking layer that covers the photodiode and the floating diffusion layer and wherein the patterned blocking layer does not cover the active region disposed between a sidewall of the selection gate and a sidewall of the reset gate, which face each other and wherein the patterned blocking layer does not cover the active region located adjacent to an opposing sidewall of the selection gate.

9. The CMOS image sensor of claim 8, wherein the patterned blocking layer covers at least a portion of the transfer gate.

10. The CMOS image sensor of claim 9, wherein the patterned blocking layer covers at least a portion of the reset gate.

11. The CMOS image sensor of claim 8, wherein the photodiode further comprises: an N type photodiode formed in the diode region; and a P type photodiode formed at a surface of the diode region on the N type photodiode.

12. The CMOS image sensor of claim 11, further comprising an N type channel diffusion layer formed in an active region beneath the transfer gate, wherein the channel diffusion layer and the N type photodiode are in electrical contact with each other.

13. The CMOS image sensor of claim 11, further comprising a P type well formed in the substrate adjacent to the diode region, wherein the P type photodiode is electrically connected to the P type well.

14. A CMOS image sensor, comprising:

a device isolation pattern formed in a substrate to define a diode region and an active region;

a photodiode formed in the diode region;

a transfer gate formed adjoining the photodiode on the active region;

a reset gate and a selection gate serially formed apart from each other on the active region separated from the transfer gate by a predetermined distance;

a floating diffusion layer formed in the active region between the transfer gate and the reset gate; and a blocking layer that covers the photodiode, the transfer gate, the floating diffusion layer, and at least a portion of the reset gate adjacent the floating diffusion layer and wherein the blocking layer does not cover the active region disposed between a sidewall of the selection gate and a sidewall of the reset gate, which face each other and wherein the blocking layer does not cover the active region located adjacent to an opposing sidewall of the selection gate.

15. The CMOS image sensor of claim 14, wherein the transfer gate has first and second sidewalls that are void of sidewall spacers, wherein the reset gate has a first sidewall adjacent the floating diffusion region which is void of a sidewall spacer and wherein the reset gate has a second sidewall opposite the first sidewall that has a sidewall spacer formed thereon, and wherein the selection gate has first and second sidewall with sidewall spacers formed thereon.

16. The CMOS image sensor of claim 15, wherein the blocking layer and the sidewall spacers on the reset gate and selection gate are formed by an anisotropic etch of a same layer of insulation material.

17. The CMOS image sensor of claim 15, further comprising: lightly doped diffusion layers formed in the active region between the reset gate and the selection gate and in the active region adjacent to the selection gate; and heavily doped diffusion layers, which are aligned to the sidewall spacers of the reset gate and selection gate, formed in the lightly doped diffusion layers.

18. The CMOS image sensor of claim 17, further comprising:

a protection layer formed on the blocking layer and sidewall spacers, and a salicide layer aligned to the protection layer formed on the heavily doped diffusion layers.

* * * * *